United States Patent
Liu (10) Patent No.: US 12,057,382 B2
(45) Date of Patent: Aug. 6, 2024

(54) CHIP ON FILM ASSEMBLY, DISPLAY PANEL, AND DISPLAY MODULE

(71) Applicant: TCL CHINA STAR OPTOELECTRONICS TECHNOLOGY CO., LTD., Shenzhen (CN)

(72) Inventor: Jinfeng Liu, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 571 days.

(21) Appl. No.: 17/294,842

(22) PCT Filed: Apr. 28, 2021

(86) PCT No.: PCT/CN2021/090474
§ 371 (c)(1),
(2) Date: May 18, 2021

(87) PCT Pub. No.: WO2022/205551
PCT Pub. Date: Oct. 6, 2022

(65) Prior Publication Data
US 2023/0137683 A1    May 4, 2023

(30) Foreign Application Priority Data
Apr. 1, 2021 (CN) .......................... 202110356984.7

(51) Int. Cl.
*H01L 23/498* (2006.01)
*G02F 1/1345* (2006.01)
(Continued)

(52) U.S. Cl.
CPC .... *H01L 23/49838* (2013.01); *G02F 1/13452* (2013.01); *G02F 1/13458* (2013.01);
(Continued)

(58) Field of Classification Search
None
See application file for complete search history.

(56) References Cited

U.S. PATENT DOCUMENTS

| | | |
|---|---|---|
| 2015/0171006 A1 | 6/2015 | Hung et al. |
| 2019/0244974 A1* | 8/2019 | Chen .................. G02F 1/1368 |
| 2020/0243039 A1* | 7/2020 | Han .................. G09G 5/006 |

FOREIGN PATENT DOCUMENTS

| | | |
|---|---|---|
| CN | 108183095 A | 6/2018 |
| CN | 108241240 A | 7/2018 |

(Continued)

*Primary Examiner* — Evren Seven
(74) *Attorney, Agent, or Firm* — The Roy Gross Law Firm, LLC; Roy Gross (57) ABSTRACT

A chip on film assembly, a display panel, and a display module are disclosed. The chip on film assembly includes a substrate, an input terminal disposed on a first end of the substrate, a plurality of output terminals disposed on a second end of the substrate, wherein the second end is opposite to the first end, and a plurality of driving chips disposed on a surface of the substrate. The driving chips are electrically connected to the input terminal and are electrically connected to the output terminals by one to one, so space utilization of chip on films (COFs) can be improved, and a problem of insufficient COF bonding spaces for high-resolution products can be solved.

2 Claims, 6 Drawing Sheets

(51) Int. Cl.
*H01L 23/13* (2006.01)
*H01L 23/538* (2006.01)
*H10K 59/82* (2023.01)

(52) U.S. Cl.
CPC .......... *H01L 23/13* (2013.01); *H01L 23/5386* (2013.01); *H10K 59/82* (2023.02); *H01L 23/4985* (2013.01); *H01L 23/5387* (2013.01)

(56) References Cited

FOREIGN PATENT DOCUMENTS

| CN | 109686720 A | 4/2019 |
|----|-------------|--------|
| CN | 209216555 U | 8/2019 |
| CN | 110827773 A | 2/2020 |
| CN | 111968525 A | 11/2020 |

* cited by examiner

CHIP ON FILM ASSEMBLY, DISPLAY PANEL, AND DISPLAY MODULE

CROSS REFERENCE TO RELATED APPLICATIONS

This application is a National Phase of PCT Patent Application No. PCT/CN2021/090474 having International filing date of Apr. 28, 2021, which claims the benefit of priority of Chinese Patent Application No. 202110356984.7, filed Apr. 1, 2021, the contents of which are all incorporated herein by reference in their entirety.

FIELD OF INVENTION

The present disclosure relates to the field of display technologies, and more particularly, to a chip on film assembly, a display panel, and a display module.

BACKGROUND OF INVENTION

With development of display technologies, requirements for high contrast ratios, high resolutions, narrow bezels, and thinness of display screens are getting higher. Resolutions of the display screens are gradually improved from high definition (HD) to full high definition (FHD), ultra-high definition (UD), and even 8K. In general, narrow bezel designs of the display screens can be realized by bonding chip on films (COFs) to the display screens to transmit data signals from driving chips into the display screens. However, with improvement of the resolutions for the display screens, more and more data signals for charging thin film transistors are also required. 65-inch 8K products have a higher resolution than 65-inch 4K products and need more COFs for driving, and since in a same panel size, more COFs are needed to be bonded, 8K ultra-HD products usually have a problem of insufficient bonding spaces for COFs.

At present, one common COF is usually bonded with one driving chip, an output terminal of the COF is connected to a display panel, and an input terminal thereof is connected to a printed circuit board (PCB). Output signals of the driving chip are much more than input signals thereof, so pins on one end of the COF connected to the PCB are relatively sparse and pins on another end of the COF connected to the display panel are denser. Therefore, there is a greater impact on an arrangement space for pins on the output terminal of the COF after improving a resolution of the display panel.

In summary, wiring designs of current COFs need to be improved.

Technical problem: embodiments of the present disclosure provide a chip on film assembly, a display panel, and a display module to solve a technical problem of insufficient COF bonding spaces caused by requiring more COFs to be bonded in a panel with a same size for improving the resolution of the display panel in current display modules.

SUMMARY OF INVENTION

In order to solve the above problems, the present disclosure provides technical solutions as follows.

An embodiment of the present disclosure provides a chip on film assembly, which includes:
a substrate;
an input terminal disposed on a first end of the substrate;
a plurality of output terminals disposed on a second end of the substrate opposite to the first end; and
a plurality of driving chips disposed on a surface of the substrate, wherein the driving chips are electrically connected to the input terminal and are electrically connected to the output terminals by one to one.

In some embodiments of the present disclosure, the output terminals are arranged in a same row along the second end of the substrate.

In some embodiments of the present disclosure, the output terminals are arranged in multiple rows along the second end of the substrate.

In some embodiments of the present disclosure, each of the output terminals includes a plurality of output pins, and the output pins of the output terminals in any two adjacent rows are staggered from each other.

In some embodiments of the present disclosure, each of the output pins in one of the multiple rows is positioned in a gap between two of the output pins in an adjacent row.

In some embodiments of the present disclosure, the output pins of the output terminals in different rows are disposed on different layers.

In some embodiments of the present disclosure, the second end of the substrate includes a first connecting part and a second connecting part disposed opposite to each other and provided with at least one of the output terminals, and the output terminals are disposed on side surfaces of the connecting parts that are opposite to each other.

In some embodiments of the present disclosure, the input terminal includes a plurality of input pins arranged in a same row along the first end of the substrate.

In some embodiments of the present disclosure, a width of the input pins is greater than a width of the output pins. An embodiment of the present disclosure further provides a display panel, which includes a display area and a non-display area, wherein the non-display area is provided with a plurality of bonding areas, and each of the bonding areas includes a plurality of bonding terminals; wherein, each of the bonding areas is configured to be bonded to the chip on film assembly in any one of the above embodiments.

In some embodiments of the present disclosure, the bonding terminals in each of the bonding areas are arranged in a same row.

In some embodiments of the present disclosure, the bonding terminals in each of the bonding areas are arranged in multiple rows.

In some embodiments of the present disclosure, each of the bonding terminals includes a plurality of bonding pins, and the bonding pins in any two adjacent rows are staggered from each other.

In some embodiments of the present disclosure, each of the bonding areas of the display panel includes a first surface and a second surface opposite to each other, and the first surface and the second surface are provided with at least one of the bonding terminals, respectively.

An embodiment of the present disclosure further provides a display module, which includes the display panel in any one of the above embodiments and a plurality of chip on film assemblies in any one of the above embodiments; wherein, each of the bonding areas of the display panel is bonded to each of the chip on film assemblies.

In some embodiments of the present disclosure, the bonding terminals in each of the bonding areas are bonded to the output terminals of each of the chip on film assemblies by one to one.

In some embodiments of the present disclosure, the output terminals are arranged in a same row along the second end of the substrate of each of the chip on film assemblies, and the bonding terminals in each of the bonding areas are arranged in a same row.

In some embodiments of the present disclosure, the output terminals are arranged in multiple rows along the second end of the substrate, and the bonding terminals in each of the bonding areas are arranged in multiple rows.

In some embodiments of the present disclosure, each of the output terminals includes a plurality of output pins, and the output pins of the output terminals in any two adjacent rows are staggered from each other; each of the bonding terminals includes a plurality of bonding pins, and the bonding pins in any two adjacent rows are staggered from each other; and the output pins in the multiple rows are bonded to the bonding pins in the multiple rows by one to one.

In some embodiments of the present disclosure, the second end of the substrate includes a first connecting part and a second connecting part disposed opposite to each other and provided with at least one of the output terminals, and the output terminals are disposed on side surfaces of the connecting parts that are opposite to each other; each of the bonding areas of the display panel includes a first surface and a second surface opposite to each other, and the first surface and the second surface are provided with at least one of the bonding terminals, respectively; and wherein, the first connecting part is bonded to the first surface, and the second connecting part is bonded to the second surface.

Beneficial effect: the plurality of driving chips are integrated into one chip on film assembly and are bonded to a same bonding area in the display panel, so the embodiments of the present disclosure can improve space utilization of chip on films (COFs), and solve a problem of insufficient COF bonding spaces for high-resolution products.

DETAILED DESCRIPTION OF PREFERRED EMBODIMENTS

The present disclosure provides a chip on film assembly, a display panel, and a display module. In order to make the purpose, technical solutions, and effects of the present disclosure clearer and more definite, the following further describes the present disclosure in detail with reference to the drawings and embodiments. It should be understood that the specific embodiments described herein are only used to explain the disclosure, and are not used to limit the disclosure.

The present disclosure is dedicated to solving a technical problem of insufficient chip on film (COF) bonding spaces caused by requiring more COFs to be bonded in a panel with a same size for improving a resolution of the display panel in current display screens. This embodiment is provided to overcome this defect.

Figure 1:
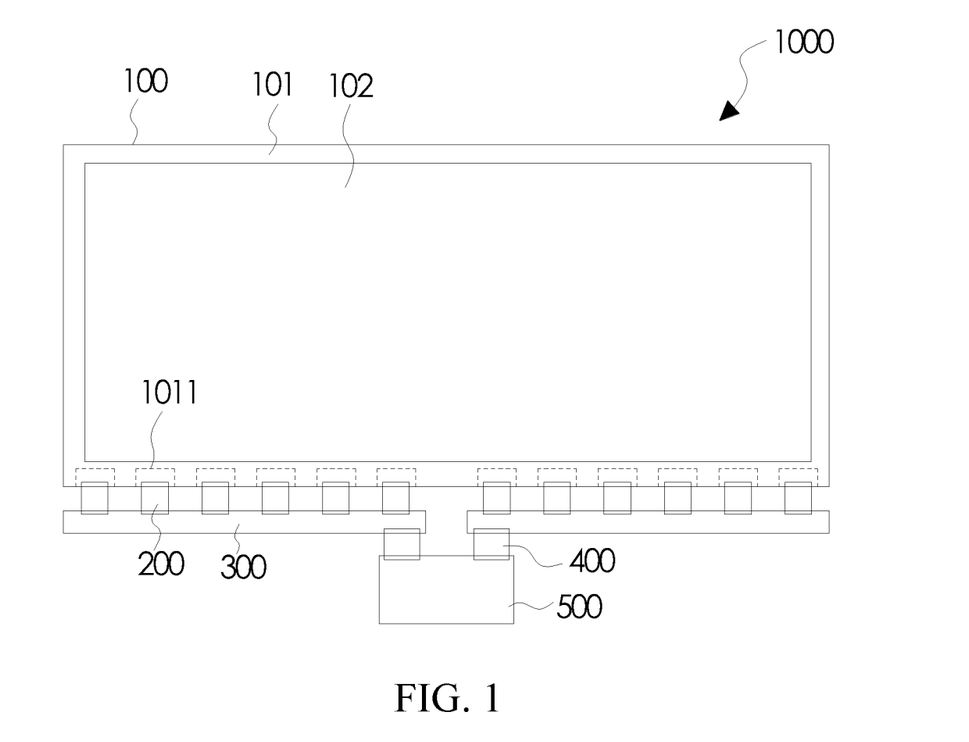
FIG. 1 is a schematic structural diagram of a display module according to an embodiment of the present disclosure.

Referring to FIG. 1, an embodiment of the present disclosure provides the display module 1000, which includes the display panel 100 and a plurality of chip on film assemblies 200 bonded to the display panel 100.

Figure 2:
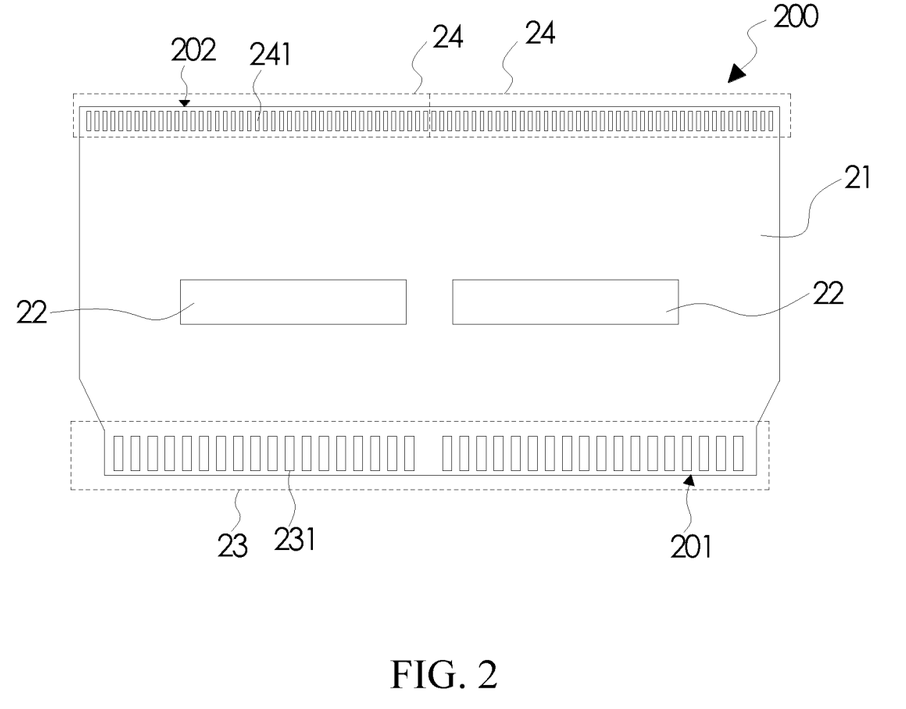
FIG. 2 is a schematic structural diagram of a chip on film assembly according to an embodiment of the present disclosure.

Referring to FIG. 2, each of the chip on film assemblies 200 includes a substrate 21, an input terminal 23, a plurality of output terminals 24, and a plurality of driving chips 22. The input terminal 23 is disposed on a first end 201 of the substrate 21, the output terminals 24 are disposed on a second end 202 of the substrate 21, which is opposite to the first end 201, and the driving chips 22 are disposed on a surface of the substrate 21. Wherein, the driving chips 22 are electrically connected to the input terminal 23 and are electrically connected to the output terminals 24 by one to one.

Figure 3:
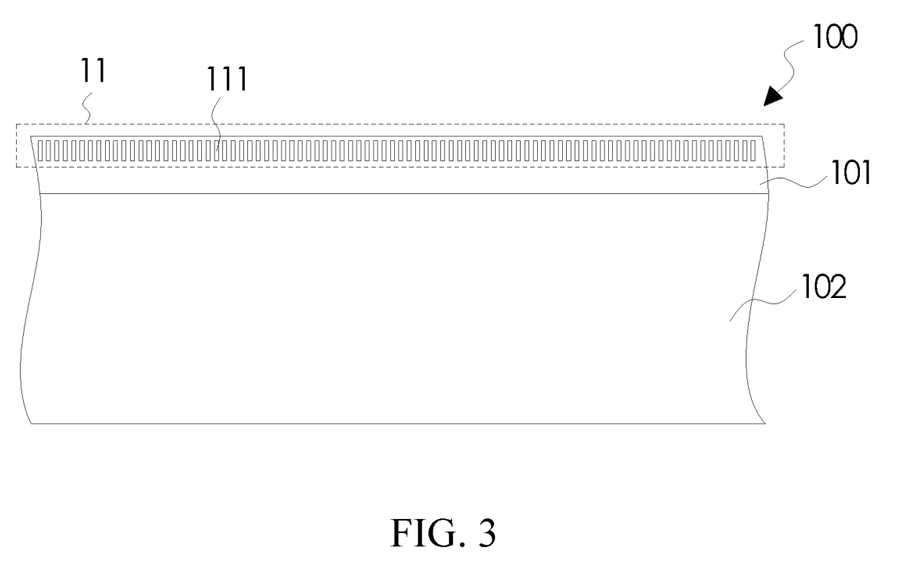
FIG. 3 is a schematic structural diagram of a display panel according to an embodiment of the present disclosure.

Referring to FIGS. 1 and 3, the display panel 100 includes a display area 102 and a non-display area 101. The non-display area 101 is provided with a plurality of bonding areas 1011, and each of the bonding areas 1011 includes a plurality of bonding terminals 11. Wherein, each of the bonding areas 1011 is configured to be bonded to each of the chip on film assemblies 200.

Further, referring to FIG. 1, the display module 1000 further includes printed circuit boards 300. Wherein, one end of each of the chip on film assemblies 200 is bonded to the display panel 100, and another end of each of the chip on film assemblies 200 opposite to the one end is bonded to one of the printed circuit boards 300. The printed circuit boards 300 are electrically connected to an external control circuit board 500 by flexible flat cables (FFCs) 400, and the chip on film assemblies 200 may be electrically connected to a same control circuit board 500 by two printed circuit boards 300, partitionally. The control circuit board 500 transmits signals to signal lines in the display panel 100 by the chip on film assemblies 200.

Specifically, in this embodiment of the present disclosure, the bonding areas 1011 may be arranged in a same row along an edge of the display panel 100. The chip on film assemblies 200 are bonded to the bonding areas 1011 by one to one.

According to characteristics of the driving chips, output signals thereof are much more than input signals thereof. Taking a source driving chip that outputs 960 channels for example, the source driving chip has 45 input pins and 960 output pins, so when the resolution of the display panel 100 is improved, there is a greater impact on a bonding space of output terminals of the COFs. The embodiments of the present disclosure mainly improve a pin layout design of the output terminals of the COFs.

Referring to FIGS. 2 and 3, in some embodiments of the present disclosure, the output terminals 24 of each of the chip on film assemblies 200 are arranged in a same row along the second end 202 of the substrate 21. A number of the chip on film assemblies 200 bonded to the display panel 100 can be reduced by integrating the driving chips 22 into one of the chip on film assemblies 200. Therefore, a space occupied by gaps among adjacent chip on film assemblies 200 can be saved, space utilization of the COFs can be improved in a certain degree, and the problem of insufficient COF bonding spaces can be solved.

The substrate 21 may be a flexible substrate, which includes, but is not limited to, a polyimide (PI) material.

Each of the output terminals 24 includes a plurality of output pins 241, and the output pins 241 are arranged in the same row along the second end 202 of the substrate 21.

Correspondingly, referring to FIG. 3, the bonding terminals 11 in each of the bonding areas 1011 of the display panel 100 are arranged in the same row, and a number of the bonding terminals 11 is same as a number of the output terminals 24 on each of the chip on film assemblies 200.

Each of the bonding terminals 11 includes a plurality of bonding pins 111, and the bonding pins 111 may be arranged in the same row along an edge of the non-display area 101. When the display panel 100 is bonded to the chip on film assemblies 200, the bonding pins 111 in each of the bonding areas 1011 of the display panel 100 is correspondingly bonded to the output pins 241 of each of the chip on film assemblies 200 by one to one.

In FIG. 2, a chip on film assembly 200 including two driving chips 22 is taken as an example for description, and each of the driving chips 22 is electrically connected to one of the output terminals 24.

Preferably, an arrangement direction of the two (the plurality of) driving chips 22 is same as an arrangement direction of the output terminals 24, which is beneficial for wiring designs of electrical connections between the driving chips 22 and the output terminals 24, thereby preventing mutual interference between each wiring.

The input terminal 23 of the chip on film assembly 200 is electrically connected to the control circuit board 500 by one of the printed circuit boards 300 and one of the FFCs 400.

The input terminal 23 includes a plurality of input pins 231, and the input pins 231 may be arranged in a same row along the first end 201 of the substrate 21. The input pins 231 are configured to be electrically connected to the one of the printed circuit boards 300.

The driving chips 22 may be source driving chips, which output driving signals to the display panel 100, and in other embodiments, the driving chips 22 may be gate driving chips, which output scanning signals to the display panel 100.

Since a number of the input pins 231 is much less than a number of the output pins 241, a width of the input pins 231 may be greater than a width of the output pins 241.

Compared to a design of disposing one driving chip on one COF in current technology, an average bonding space occupied by each of the driving chips 22 in this embodiment is less than a bonding space occupied by each driving chip 22 in current technology by increasing a width of the chip on film assembly 200, integrating the plurality of driving chips 22 into the chip on film assembly 200, and reducing the width of the output pins 241. Therefore, this embodiment of the present disclosure can improve the space utilization of COFs.

Figure 4:
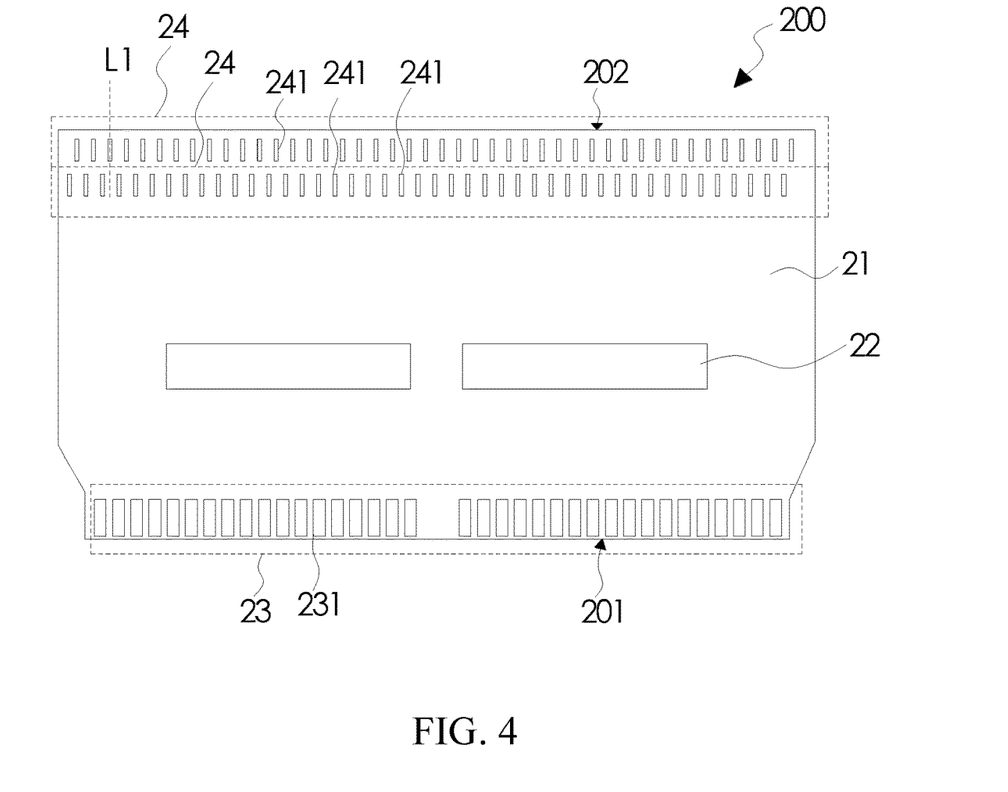
FIG. 4 is a schematic structural diagram of the chip on film assembly according to another embodiment of the present disclosure.
Figure 5:
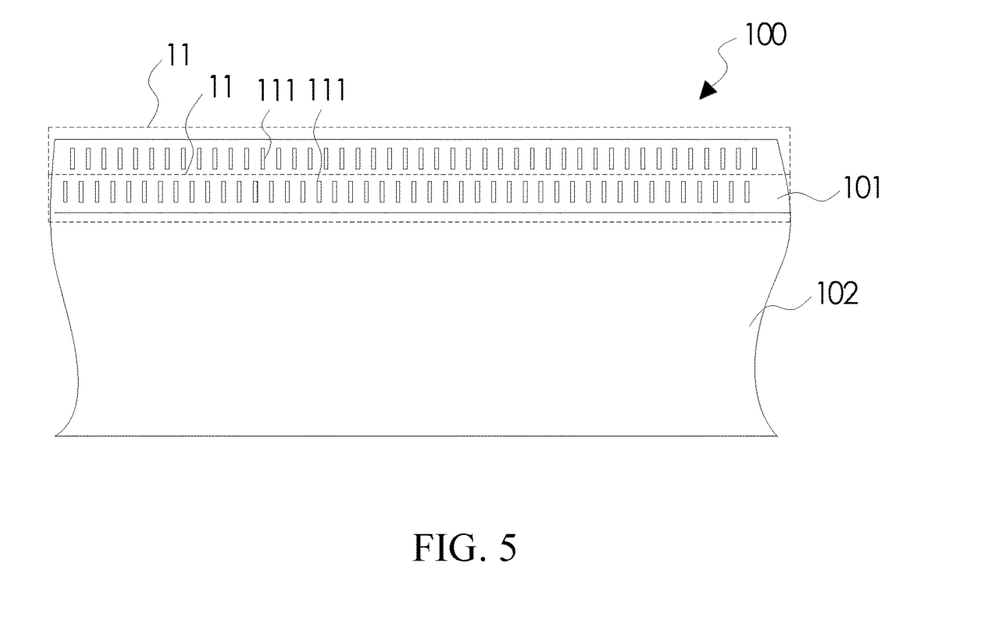
FIG. 5 is a schematic structural diagram of the display panel according to another embodiment of the present disclosure.

Referring to FIGS. 4 and 5, a difference from the above embodiment is that the output terminals 24 of the chip on film assembly 200 in this embodiment are arranged in multiple rows. Correspondingly, the bonding terminals 11 in each of the bonding areas 1011 of the display panel 100 are arranged in multiple rows, and the output terminals 24 are correspondingly bonded to the bonding terminals 11 by one to one. Disposing the output terminals 24 in the multiple rows can reduce the width of the chip on film assembly 200 required for bonding to the display panel 100 and thus solves the problem of insufficient COF bonding space for high-resolution products, and in another aspect, production costs of the chip on film assembly 200 can be saved.

Further, referring to FIGS. 4 and 5, each of the output terminals 24 includes the plurality of output pins 241, and the output pins 241 of the output terminals 24 in any two adjacent rows are staggered from each other. Correspondingly, each of the bonding terminals 11 includes the plurality of bonding pins 111, and the bonding pins 111 of the bonding terminals 11 in any two adjacent rows are staggered from each other. Wherein, the output pins 241 in the multiple rows are correspondingly bonded to the bonding pins 111 in the multiple rows by one to one.

Since wirings need to be disposed between the output pins 241 in each of the multiple rows and the driving chips 22 which are electrically connected thereto, it is necessary to provide a wiring space for the output pins 241 in each of the multiple rows. In order to prevent the mutual interference between the wirings connected to the output pins 241 in each of the multiple rows, the output pins 241 in each of the multiple rows may be staggered from each other.

Preferably, each of the output pins 241 in each of the multiple rows is positioned in a gap between two of the output pins 241 in an adjacent row. That is, an orthographic projection of one straight line L extending along a column direction and penetrating though one of the output pins 241 on the substrate 21 does not intersect with an orthographic projection of the output pins 241 in the adjacent row on the substrate 21.

In addition, the output pins 241 of the output terminals 24 in different rows may be disposed on different layers, and the output pins 241 in adjacent rows may be insulated from each other by an insulating layer. It should be noted that the insulating layer cannot shield the output pins 241 in a lower layer and needs to expose the output pins 241 in the lower layer.

Referring to FIG. 4, two rows of output terminals 24 and two driving chips 22 are taken as an example in this embodiment. The two rows of output terminals 24 are electrically connected to the two driving chips 22, respectively. One row of output terminal 24 adjacent to an edge of the second end 202 is an output terminal 24 in a first row, and another row of output terminal 24 away from the edge of the second end 202 is an output terminal 24 in a second row.

Specifically, output pins 241 in the first row can be formed on the second end 202 of the substrate 21 and the input pins 231 can be formed on the first end 201 by depositing a first metal layer on the substrate 21 and etching the first metal layer. The wirings are configured to electrically connect each of the output pins 241 to output terminals of the driving chips 22 or are configured to electrically connect each of the input pins 231 to input terminals of the driving chips 22.

Then the insulating layer is deposited on the first metal layer and is etched to expose at least the output pins 241 in the first row and the input pins 231, and a second metal layer is deposited on the insulating layer and is etched to form output pins in the second row and patterned wirings. Wherein, the insulating layer can be provided with through-holes, and the wirings formed by the second metal layer can be connected to the metal layer in the lower layer by the through-holes, thereby realizing electrical connections between the output pins in the second row and one of the driving chips 22 corresponding thereto.

Materials of the first metal layer and the second metal layer include, but are not limited to, copper.

Compared to the design of disposing one driving chip on one COF in current technology, this embodiment designs the output pins 241 to be arranged in the multiple rows and reduces the width of the output pins while integrating the plurality of driving chips 22 into the chip on film assembly 200, so that in a case of a same COF bonding width, more output pins can be accommodated in one COF. Therefore, the space utilization of COFs can be greatly improved. Compared to the embodiment in FIG. 2, this embodiment does not need to increase a bonding width of the chip on film assembly, so the space utilization of the chip on film assembly can be further improved.

Figure 6:
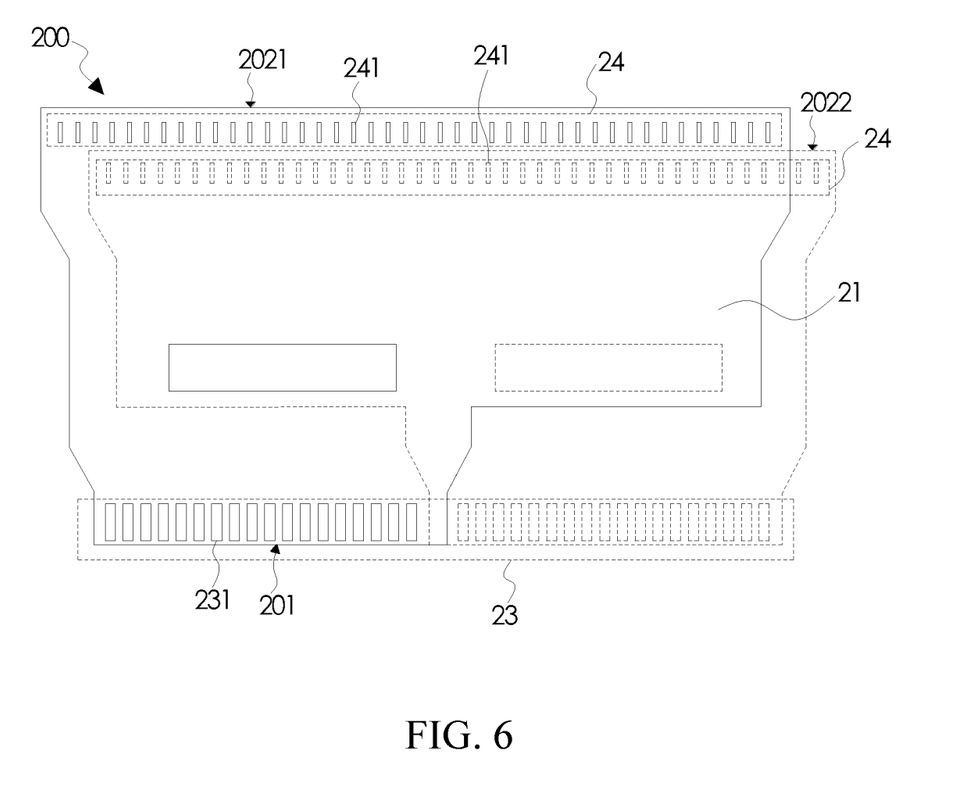
FIG. 6 is a schematic structural diagram of the chip on film assembly according to yet another embodiment of the present disclosure.
Figure 7:
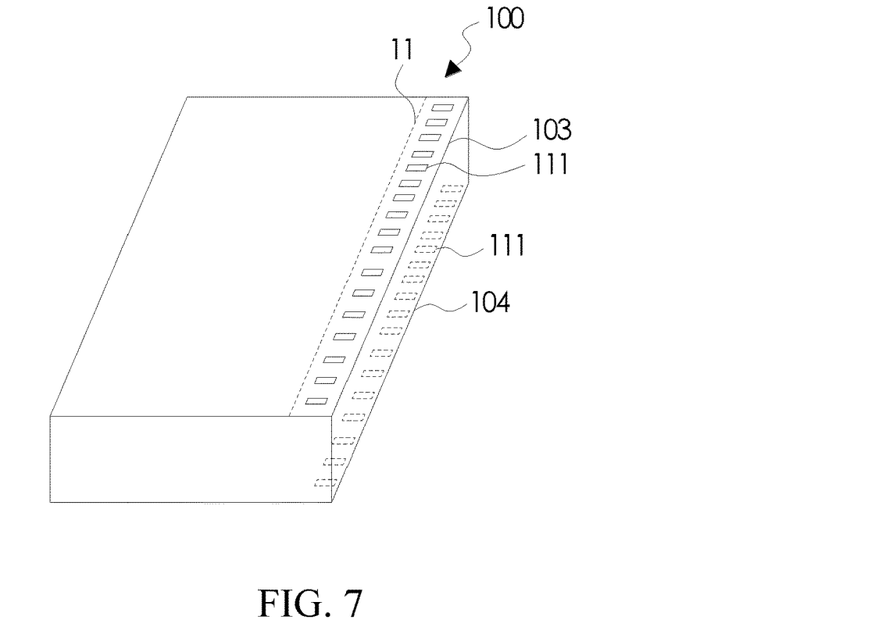
FIG. 7 is a schematic structural diagram of the display panel according to yet another embodiment of the present disclosure.

Referring to FIGS. 6 and 7, compared to the two embodiments above, the second end of the chip on film assembly 200 in this embodiment includes two connecting parts. The two connecting parts are bonded to upper and lower surfaces of one of the bonding areas of the display panel 100, so an effective bonding space of the display panel 100 can be fully utilized, and the problem of insufficient bonding spaces for high-resolution products can be solved.

Specifically, referring to FIG. 6, the second end on the substrate 21 of the chip on film assembly 200 includes a first connecting part 2021 and a second connecting part 2022 disposed opposite to each other and provided with at least one of the output terminals 24, and the output terminals 24 are disposed on side surfaces of the connecting parts that are opposite to each other.

Correspondingly, each of the bonding areas of the display panel 100 includes a first surface 103 and a second surface 104 opposite to each other, and the first surface 103 and the second surface 104 are provided with at least one of the bonding terminals 11, respectively.

Referring to FIGS. 6 and 7, the first connecting part 2021 is bonded to the first surface 103, and the second connecting part 2022 is bonded to the second surface 104.

In some embodiments, when the first connecting part 2021 or the second connecting part 2022 includes a plurality of the output terminals 24, the output terminals 24 may be arranged in the same row along a length direction of a corresponding connecting part, and a specific arrangement method may refer to the description of FIG. 2. The output terminals 24 may also be arranged in the multiple rows along the length direction of the corresponding connecting part, and the specific arrangement method may refer to the arrangement in FIG. 4.

It can be understood that correspondingly, when the output terminals 24 in each of the connecting parts are arranged in the same row or in the multiple rows, the bonding terminals 11 on corresponding surfaces of each of the bonding areas of the display panel 100 have same arrangement as the output terminals 24, thereby realizing bonding between the display panel 100 and the chip on film assembly 200.

Referring to FIGS. 6 and 7, this embodiment having each of the connecting parts be provided with one output terminal 24 is taken as an example for description. The first connecting part 2021 and the second connecting part 2022 both include one output terminal 24 which includes the plurality of output pins 241 arranged in the same row. Correspondingly, the first surface 103 and the second surface 104 in each of the bonding areas of the display panel 100 are respectively provided with one bonding terminal 11 which includes the plurality of bonding pins 111 arranged in the same row. Wherein, the output pins 241 in the same row of the first connecting part 2021 are bonded to the bonding pins 111 in the same row of the first surface 103, and the output pins 241 in the same row of the second connecting part 2022 are bonded to the bonding pins 111 in the same row of the second surface 104.

Figure 8:
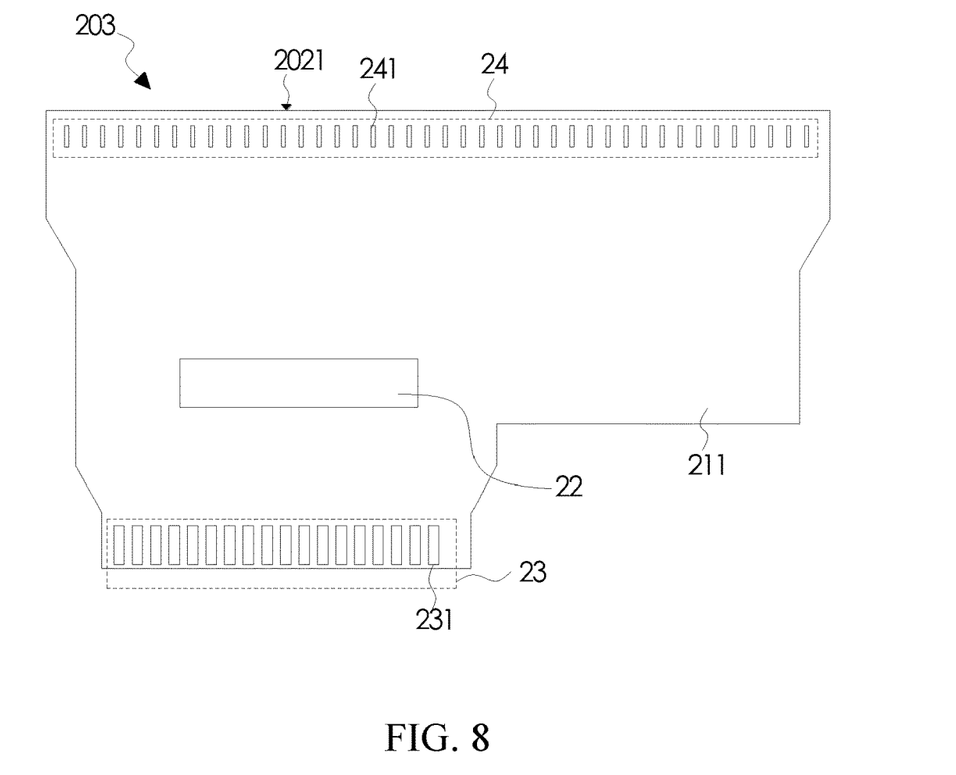
FIG. 8 is a schematic structural diagram of a first chip on film of the chip on film assembly in FIG. 6.
Figure 9:
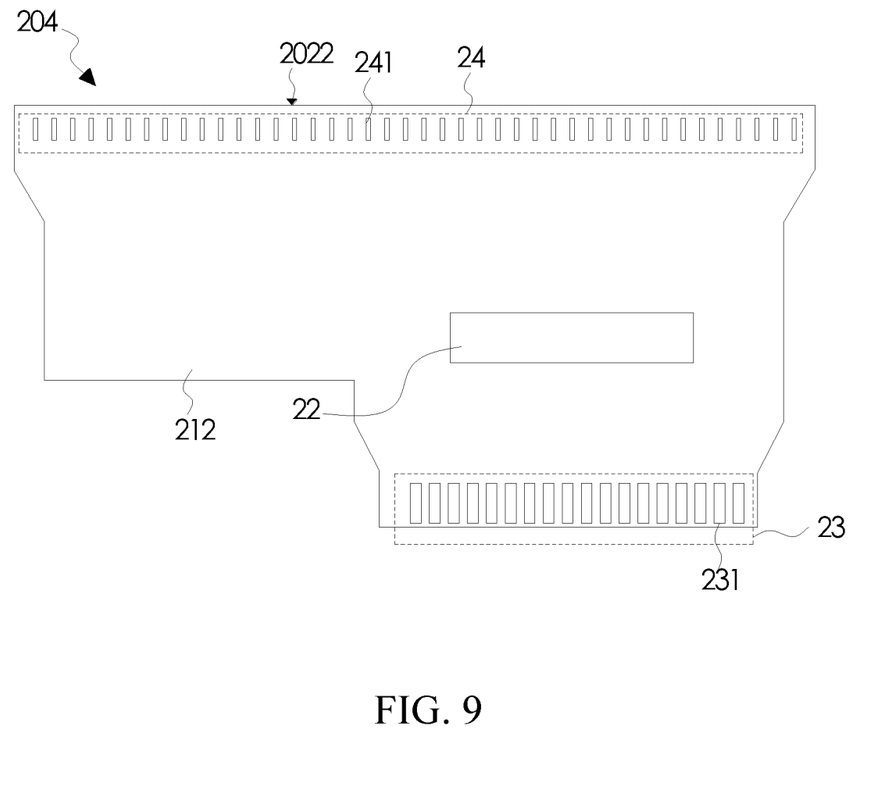
FIG. 9 is a schematic structural diagram of a second chip on film of the chip on film assembly in FIG. 6.

Referring to FIGS. 6, 8, and 9, the chip on film assembly 200 in this embodiment may be formed by laminating a first chip on film 203 and a second chip on film 204 together.

Specifically, the first chip on film 203 includes a first substrate 211, at least one driving chip 22 is disposed on a surface of the first substrate 211, and at least one output terminal 24 is disposed on one end of the first substrate 211.

The second chip on film 204 includes a second substrate 212, at least one driving chip 22 is disposed on a surface of the second substrate 212, and at least one output terminal 24 is disposed on one end of the second substrate 212.

A part of the input pins 231 of the input terminal 23 of the chip on film assembly 200 may be disposed on the first chip on film 203, and another part of the input pins 231 may be disposed on the second chip on film 204.

In other embodiments, all of the input pins 231 of the input terminal 23 of the chip on film assembly 200 may be disposed on a same chip on film.

The first chip on film 203 and the second chip on film 204 are laminated after manufacturing the input pins 231, the output pins 241, and the driving chips 22 on the first substrate 211 and the second substrate 212. Two ends of the first substrate 211 and the second substrate 212 having the input pins 231 are laminated together, and another two ends having the output pins 241 are not laminated to allow the another two ends to become free ends and to form the first connecting part 2021 and the second connecting part 2022 of the chip on film assembly 200. Therefore, the chip on film assembly 200 being divided and bonded to the upper and lower surfaces (the first surface and the second surface) in each of the bonding areas of the display panel 100 can be realized.

The first surface 103 is one of a light-emitting surface or a surface opposite to the light-emitting surface of the display panel 100, and the second surface 104 is another one thereof. In this embodiment, the first surface 103 is the light-emitting surface, and the second surface 104 is the surface opposite to the light-emitting surface.

Since signal lines such as data lines and scanning lines are all disposed on the light-emitting surface, the bonding areas 1011 of the display panel 100 need to be provided with through-holes to allow the bonding pins 111 on the second surface 104 to be electrically connected to the signal lines on the light-emitting surface by the through-holes.

Referring to FIGS. 8 and 9, laminating two chip on films to form the chip on film assembly 200 can omit a process of bonding the input terminal 23 to the printed circuit boards 300.

The first substrate 211 and the second substrate 212 are both flexible substrates, which include, but are not limited to, flexible materials such as polyimide (PI).

The display panel 100 mentioned in the embodiments above includes, but is not limited to, one of LCD display panels or OLED display panels.

By laminating two layers of chip on films together to be bonded to front and back surfaces of each of the bonding areas 1011 of the display panel 100, respectively, this embodiment can fully utilize an effective space of the display panel, improves the space utilization of COFs, and solves the problem of insufficient bonding spaces for high-resolution products.

It can be understood that for a person of ordinary skill in the art, equivalent replacements or changes can be made according to the technical solution of the present disclosure and its inventive concept, and all these changes or replacements should fall within the protection scope of the claims attached to the present disclosure.

What is claimed is:

1. A display module, comprising a display panel and a plurality of chip on film assemblies;
wherein each of the chip on film assemblies comprises:
a substrate;
an input terminal disposed on a first end of the substrate;
a plurality of output terminals disposed on a second end of the substrate, wherein the second end is opposite to the first end; and
a plurality of driving chips disposed on a surface of the substrate, wherein the driving chips are electrically connected to the input terminal and are electrically connected to the output terminals by one to one;
the display panel comprises a display area and a non-display area, the non-display area is provided with a plurality of bonding areas, and each of the bonding areas comprises a plurality of bonding terminals; and
wherein each of the bonding areas of the display panel is bonded to each of the chip on film assemblies;
the output terminals are arranged in multiple rows along the second end of the substrate of each of the chip on film assemblies, and the bonding terminals in each of the bonding areas are arranged in multiple rows;
each of the output terminals comprises a plurality of output pins, and the output pins of the output terminals in any two adjacent rows are staggered from each other;
each of the bonding terminals comprises a plurality of bonding pins, and the bonding pins of the bonding terminals in any two adjacent rows are staggered from each other; and
the output pins in the multiple rows are bonded to the bonding pins in the multiple rows by one to one.

2. The display module according to claim 1, wherein the second end of the substrate of each of the chip on film assemblies comprises a first connecting part and a second connecting part disposed opposite to each other and provided with at least one of the output terminals, and the output terminals are disposed on side surfaces of the connecting parts that are opposite to each other;
each of the bonding areas of the display panel comprises a first surface and a second surface opposite to each other, and the first surface and the second surface are provided with at least one of the bonding terminals, respectively; and
wherein the first connecting part is bonded to the first surface, and the second connecting part is bonded to the second surface.

* * * * *